United States Patent
Ito

[11] Patent Number: 5,930,612
[45] Date of Patent: Jul. 27, 1999

[54] METHOD OF MANUFACTURING COMPLEMENTARY MOS SEMICONDUCTOR DEVICE

[75] Inventor: Hiroshi Ito, Tokyo, Japan

[73] Assignee: NEC Corporation, Tokyo, Japan

[21] Appl. No.: 09/013,669

[22] Filed: Jan. 26, 1998

[30] Foreign Application Priority Data

Jan. 24, 1997 [JP] Japan .................................. 9-011087

[51] Int. Cl.⁶ ............................ H01L 21/40; H01L 21/44
[52] U.S. Cl. ......................... 438/199; 438/305; 438/592; 438/217; 257/413
[58] Field of Search ................................. 438/199, 299, 438/305, 592; 257/104, 344, 316, 305, 413

[56] References Cited

U.S. PATENT DOCUMENTS

| | | | |
|---|---|---|---|
| 3,947,681 | 3/1976 | Javan ........................................ | 257/104 |
| 5,529,940 | 6/1996 | Yamamoto et al. ..................... | 438/268 |
| 5,656,839 | 8/1997 | Komori et al. ......................... | 257/316 |
| 5,723,893 | 3/1998 | Yu et al. ................................. | 257/413 |
| 5,783,850 | 7/1998 | Liau et al. .............................. | 257/355 |
| 5,817,562 | 10/1998 | Chang et al. ........................... | 438/305 |
| 5,837,601 | 11/1998 | Matsumoto ............................. | 438/592 |
| 5,840,609 | 11/1998 | Hyeon et al. ........................... | 438/299 |

FOREIGN PATENT DOCUMENTS

| | | |
|---|---|---|
| 4-287929 | 10/1992 | Japan . |
| 5-218436 | 8/1993 | Japan . |
| 6-169082 | 6/1994 | Japan . |
| 6-296016 | 10/1994 | Japan . |
| 6-326304 | 11/1994 | Japan . |

*Primary Examiner*—Olik Chaudhuri
*Assistant Examiner*—William David Coleman
*Attorney, Agent, or Firm*—Foley & Lardner

[57] ABSTRACT

A method of manufacturing a complementary MOS device, comprising the steps of:

(a) forming a gate insulating film on one major surface of a semiconductor substrate;

(b) forming a first amorphous silicon film on said gate insulating film;

(c) forming an oxide film having a thickness of about 1 nm on a surface of said first amorphous silicon film;

(d) forming a second amorphous silicon film on said oxide film;

(e) annealing said first and second amorphous silicon films to crystalize said first and second amorphous silicon films;

(f) forming said first amorphous silicon film and said second amorphous silicon film into gate electrodes and simultaneously ion-implanting an n-type impurity into nMOSFET regions and a p-type impurity into pMOSFET regions; and (g) activating said n- and p-type impurities by the rapid thermal annealing.

9 Claims, 5 Drawing Sheets

METHOD OF MANUFACTURING COMPLEMENTARY MOS SEMICONDUCTOR DEVICE

BACKGROUND OF THE INVENTION

1. Field of the Invention

The present invention relates to a method of manufacturing a semiconductor device and, more particularly, to a method of forming the gate electrode of a complementary MOS device with a p-n gate.

2. Description of the Prior Art

As semiconductor integrated circuits are constantly being reduced in sizes and increasing densities, the design rule is also gradually becoming small, and it will be soon on the order of quarter micrometer (quarter μm: 0.25 μm). Conventionally, an $n^+$-type gate is employed for the gate electrode of a complementary MOS device (to be simply referred to as a CMOS hereinafter): an nMOSFET or a pMOSFET.

This $n^+$-type gate is formed by, e.g., diffusing phosphorus immediately after a polysilicon film deposition. When the $n^+$-type gate is to be employed for a pMOSFET, the manufacturing process can be shortened although there is a serious problem that the threshold voltage largely varies in respect to the variation in gate length. When the gate length was larger than the quarter micrometer, the variation of threshold voltage corresponding to the variation of gate length due to manufacturing variations could be managed by keeping the threshold voltage of the transistor somewhat high because the power supply voltage was relatively high.

However, in quarter micrometer CMOS, the power supply voltage is generally 2.5 V or less, and the threshold voltage of the transistor must be lowered. If the $n^+$-type gate is employed for a pMOSFET, the threshold voltage does not stabilize and cannot guarantee the stability of circuit operation, resulting in a decrease in manufacturing yield.

As the gate electrode structure of a CMOS, a p-n gate is becoming the mainstream: an $n^+$-type gate for an nMOSFET, and a $p^+$-type gate for a pMOSFET. The $n^+$- and $p^+$-type gate electrodes are generally formed simultaneously with formation of $n^+$- and $p^+$-type diffusion layers by ion implantation. Tungsten polycide which is conventionally used to lower the resistance of the gate electrode cannot be used as the p-n gate. Because the tungsten polycide enhances lateral diffusion of impurities at source/drain activation. The lateral diffusion causes the variation of the threshold voltage. Generally, after $n^+$- and $p^+$-type gate electrodes and diffusion layers are formed, the gate electrodes and diffusion layers are salicided by titanium or cobalt.

However, this p-n gate also has two problems: I)boron penetration through the gate oxide at the source/drain activation, which causes a variation of the threshold voltage. II)the low gate yield of pMos that is caused by a destruction of the gate oxide, and this is a serious problem for the semiconductor device. It has been reported that the gate yield is related to the boron penetration.

In order to eliminate the boron penetration, a gate electrode structure with at least two polysilicon layers which are formed by different process conditions has been proposed, as disclosed in Japanese Unexamined Patent Publication No. 6-296016. According to an embodiment described in Japanese Unexamined Patent Publication No. 6-296016, after a first polysilicon film is deposited, ion implantation is performed to adjust the threshold value, and then, a second polysilicon film is deposited by a method that differs from one for the first polysilicon deposition. The gate electrode consists of two polysilicon layers with different crystal structures and it prevents boron channeling at source/drain implantation.

However, this method has some problems. Since the ion implantation for the adjustment of threshold voltage is performed through the gate oxide film, the gate oxide film is inevitably damaged. As a result, the reliability of the gate oxide degrades. It is a serious problem for semiconductor devices. In addition since the ion implantation for the adjustment of threshold voltage is also performed through the first polysilicon film, the ion implantation energy must be inevitably made higher. The impurity profile has a long tail. As a result, the junction capacitance. Furthermore, to form at least two polysilicon films by different deposition methods, a plurality of furnaces must be prepared. Alternatively, if only one furnace is to be used, the film formation conditions such as the temperature and source materials must be changed for each film. Therefore, the cost increases, or the manufacturing yield lowers unavoidably due to generation of particles.

The degradation of the pMOS yield as the second problem is conspicuous when the gate electrode material is polysilicon.

The present inventor has examined a technique of implanting phosphorus in polysilicon in advance, as disclosed in Japanese Unexamined Patent Publication No. 5-218436. This technique could improve the gate yield to some extent but was not perfect.

Next, as disclosed in Japanese Unexamined Patent Publication No. 6-326304, studies have been made using phosphorus-doped amorphous silicon as a gate electrode material. The yield of pMOSs whose gates have the rated breakdown voltage greatly increased, as shown in FIGS. 1A and 1B. Is was also confirmed that the phosphorus-doped amorphous silicon could suppress boron penetration in annealing. However, when a CMOS device was manufactured using the phosphorus-doped amorphous silicon as a gate electrode material, an anomalous hump appeared in the subthreshold characteristics of an nMOSFET with a gate length of 0.5 μm or less, as shown in FIG. 2. The reason for this is as follows. Large columnar grains having a height corresponding to the film thickness are grown when crystallizing the phosphorus-doped amorphous silicon film. At source/drain implantation, the arsenic channeling occurs in the grains with the lattice orientation in which the channeling is likely to occur. The a local variation in the concentration of surface impurities occurs. As a result, the hump appears in the subthreshold characteristics.

Plane TEM observation of the phosphorus-doped amorphous silicon film revealed that the grain size was about 0.5 μm. As described above, the subthreshold characteristics of an nMOSFET with a gate length of 0.5 μm or less have a hump. This has a close relation to the grain size, and it can be explained that when the grains in the gate electrode become a bamboo structure, a hump appears in the subthreshold characteristics.

The first problem in the CMOS using the p-n gate is that, in the prior art, the gate of pMOS degrades. The reason for this is related to boron penetration through the gate oxide film.

The second problem is that a hump appears in the subthreshold characteristics when the phosphorus-doped amorphous silicon is used for the improvement of the pMOS gate yield.

The reason for this is as follows. At source/drain implantation, the arsenic channeling occurs in the grains with the lattice orientation in which the channeling is likely to occur. Then, a local variation in the concentration of surface impurities occurs. As a result, the hump appears in the subthreshold characteristics.

SUMMARY OF THE INVENTION

The present invention has been made in consideration of the above situation of the prior art, and has as its object to improve the reliability of a gate oxide film and, more particularly, to provide a method of manufacturing a semiconductor device, which solves problems of the prior art, i.e., both the low gate yield of the pMOS and the anomalous subthreshold characteristics of the nMOSFET in a CMOS with a p-n gate.

In order to achieve the above object, according to the main aspect of the present invention, there is provided a method of manufacturing complementary MOS devices, comprising the steps of:

(a) forming a gate insulating film on one major surface of a semiconductor substrate;

(b) depositing a first amorphous silicon film on the gate insulating film;

(c) forming an oxide film with a thickness of about 1 nm on a surface of the first amorphous silicon film;

(d) depositing a second amorphous silicon film on the oxide film;

(e) annealing the first and the second amorphous silicon films in order to crystalize the first and the second amorphous silicon films;

(f) forming the first amorphous silicon film and the second amorphous silicon film into gate electrodes and ion-implanting an n-type impurity into nMOSFETs regions and a p-type impurity into a pMOSFETs regions; and (g) activating the n- and p-type impurities by the rapid thermal annealing.

The present invention has not only the above main aspect but also several supplementary aspects as defined in the appended claims.

Since gate electrode is composed of the stacked silicon layers that are separated an ultra-thin oxide layer, the lattice orientation differs between the first and the second silicon films that are formed by crystallizing amorphous silicon films. As a result, a hump disappears in the subthreshold characteristics of the nMOSFET, as shown in FIG. 2, because arsenic channeling is suppressed due to the difference of the lattice orientation between the first and the second silicon films. Since about 1-nm thick oxide easily conducts the direct tunneling current, the first and the second silicon films are not electrically insulated. An impurity such as boron can also easily pass through the about 1-nm thick oxide film.

According to the present invention, for the p-n gate CMOS, the first effect of suppressing the decrease in yield due to initial breakdown of the gate of the pMOS can be obtained.

This is because when employment of phosphorus-doped amorphous silicon for a gate electrode suppresses boron penetration.

The second effect of the present invention is that when phosphorus-doped amorphous silicon having a multilayered structure in which phosphorus-doped amorphous silicon layers are separated by an about 1-nm thick oxide film is employed for the gate electrode, the kink in the subthreshold characteristics of the nMOSFET, which is generated in case of a single phosphorus-doped amorphous silicon layer, can be suppressed.

The reason for this is as follows. Since the gate electrode is composed the stacked silicon layers that are separated an about 1-nm thick oxide film, the lattice orientation differs between the first and the second silicon films. Therefore, arsenic channeling is suppressed. Namely, no arsenic is partially ion-implanted in to the channel regions of the transistor by the channeling.

The above and many other advantages, features and additional objects of the present invention will become manifest to those versed in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Some preferred embodiments of the present invention will be described below with reference to the accompanying drawings.

FIGS. 3A to 3F are sectional views showing the steps in manufacturing a semiconductor device according to the first embodiment of the present invention.

Figure 1A:
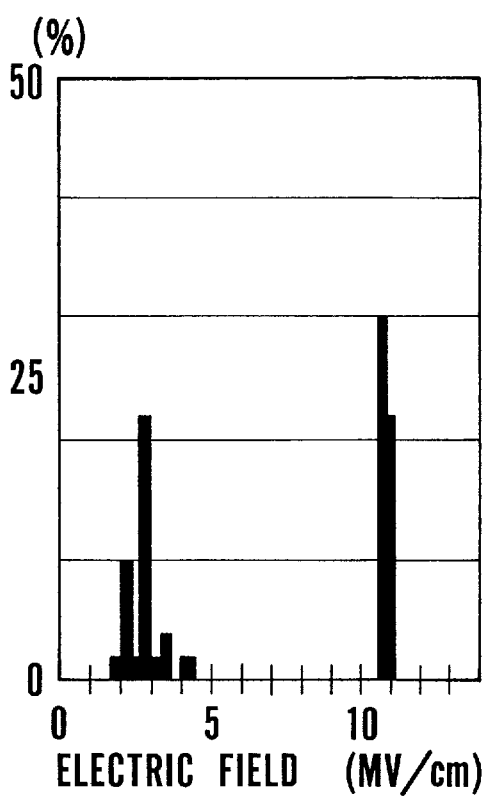
FIGS. 1A and 1B are histograms showing conventional dielectric breakdown distributions observed when polysilicon is used as an electrode, and when phosphorus-doped amorphous silicon is used as an electrode.
Figure 1B:
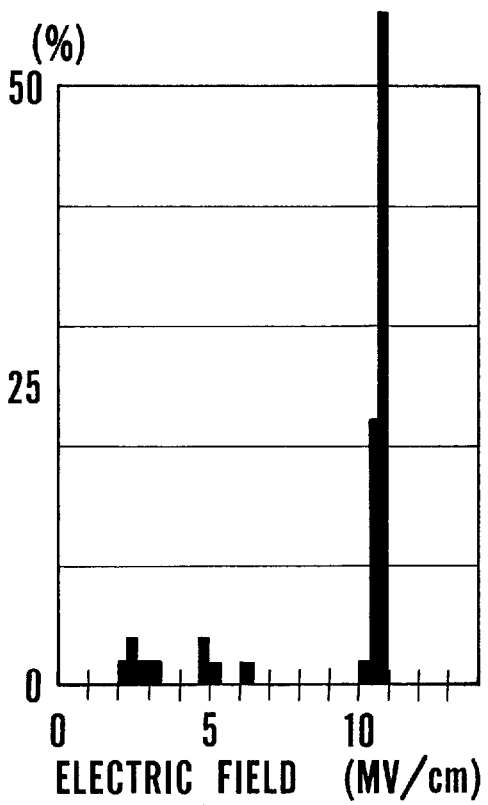
Figure 2:
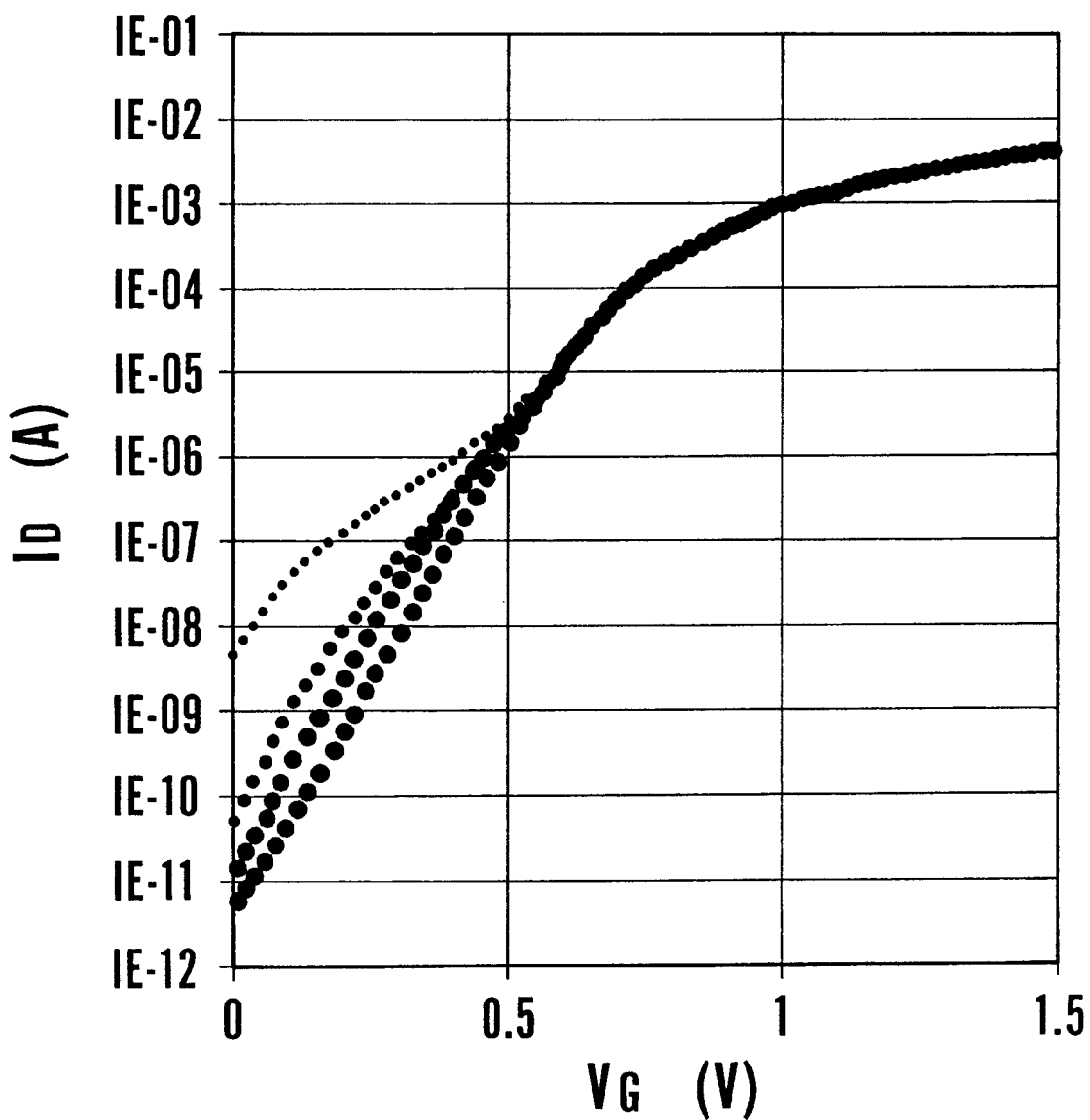
FIG. 2 is a graph showing the subthreshold characteristics of a conventional nMOSFET.
Figure 3A:
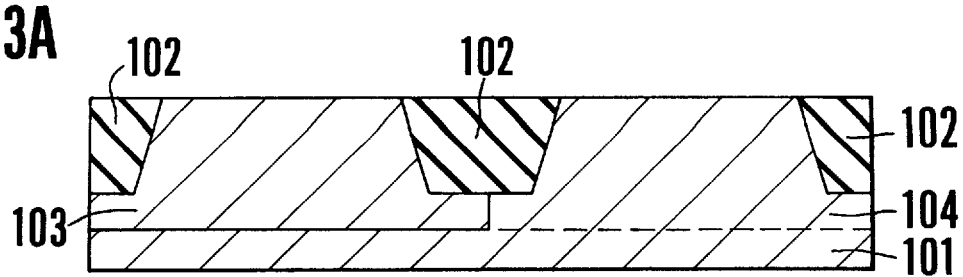
FIGS. 3A to 3F are sectional views showing the steps in manufacturing a semiconductor device according to the first embodiment of the present invention.
Figure 3B:
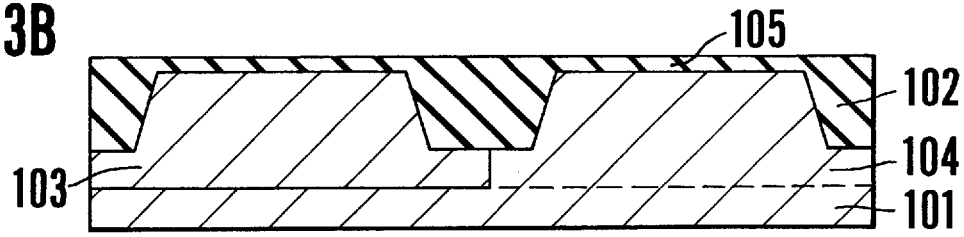

As shown in FIG. 3A, an isolation region 102, an n-type well 103, and a p-type well 104 are formed on one major surface of a semiconductor substrate 101. As shown in FIG. 3B, a gate oxide film 105 with a thickness of 5 to 6 nm is formed in the active regions. As a gate electrode material, a first phosphorus-doped amorphous silicon film 106 with a thickness of 100 nm is formed on the gate oxide film 105 by LPCVD (Low-Pressure Chemical Vapor Deposition).

Figure 3C:
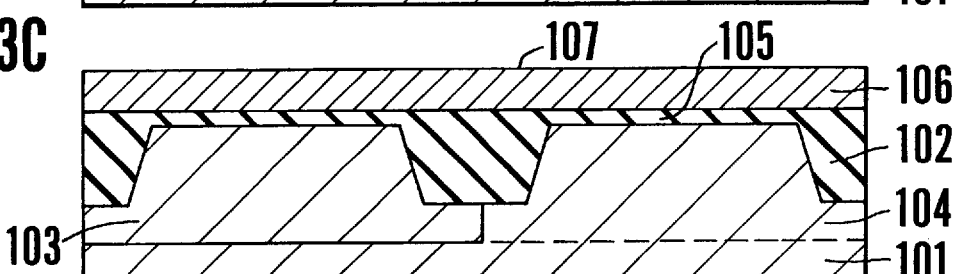
Figure 3D:
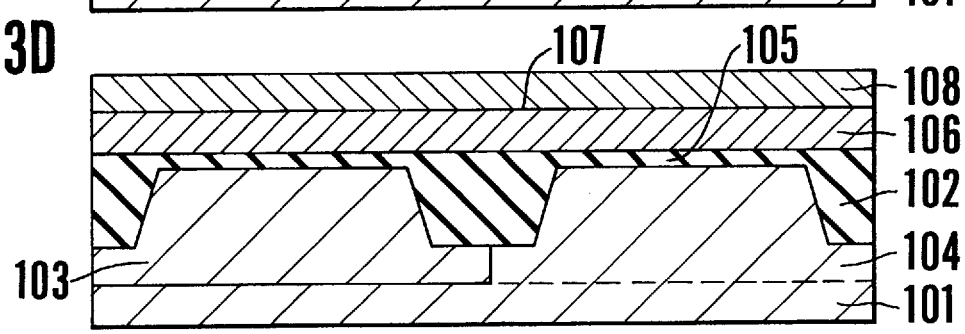

The first phosphorus-doped amorphous silicon film 106 is deposited at a temperature of 500° C. to 600° C. The concentration of phosphorus is set within the range of 1 to $5 \times 10^{19}$ cm$^{-3}$. After the deposition of the first phosphorus-doped amorphous silicon film 106, the semiconductor substrate is temporarily removed from the growth furnace to form a native oxide film 107 having a thickness of about 1 nm on the surface of the first phosphorus-doped amorphous silicon film 106 (FIG. 3C). Next, a second phosphorus-doped amorphous silicon film 108 with a thickness of 100 nm is formed again, as shown in FIG. 3D. From the viewpoint of manufacturing cost and yield, it is preferable that the deposition the formation condition for the second phosphorus-doped amorphous silicon film 108 is preferably the same as those for the first phosphorus-doped amorphous silicon film 106, although it is not a requirement.

The first and second phosphorus-doped amorphous silicon films 106 and 108 are annealed at a temperature of 800°

Figure 3E:
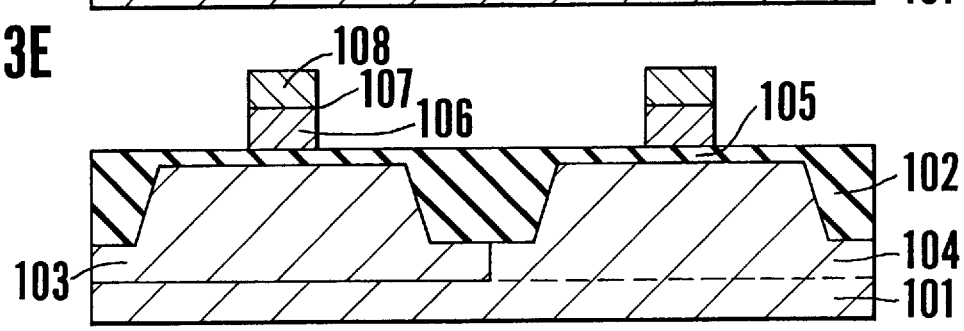

C. or more and less than 1,000° C. to crystalize the amorphous silicon. It was confirmed that if this crystallization is made at 1,000° C. or more, gate breakdown increases. Thereafter, a gate electrode is formed by photolithography (FIG. 3E).

Figure 3F:
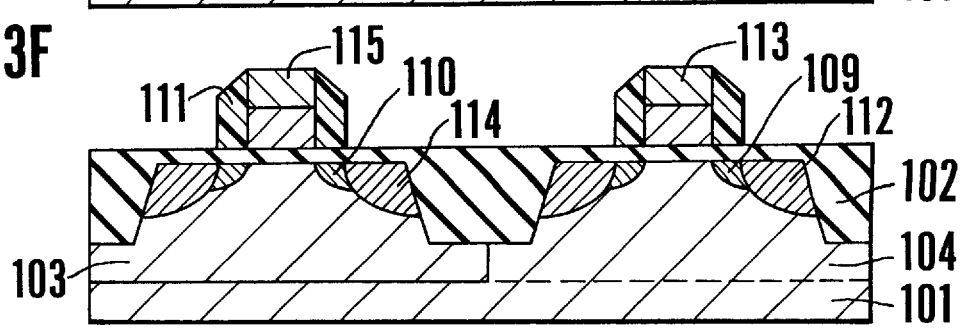

LDD implantation is selectively performed for the nMOSFET region or pMOSFET region, as needed. Arsenic or phosphorus is ion-implanted into the nMOSFET region, and boron or $BF_2$ into the pMOSFET region. After formation of the LDD layer, side wall spacers 111 are formed on the side wall of each gate electrode. In addition, as shown in FIG. 3F, an $n^+$-type diffusion layer 112 and a $n^+$-type gate electrode 113, and a $p^+$-type diffusion layer 114 and a $p^+$-type gate electrode 115 are selectively formed in desired regions.

For example, arsenic is ion-implanted into the nMOSFET region at an acceleration energy of 50 keV and a dose of 1 to $3\times10^{15}$ cm$^{-2}$, and $BF_2$ is ion-implanted into the pMOSFET region at an acceleration energy of 30 kev and a dose of 1 to $3\times10^{15}$ cm$^{-2}$. Since phosphorus has been doped into the gate of the pMOSFET in advance, the phosphorus must be repelled by $BF_2$ to form the $p^+$-type gate of the pMOSFET. The phosphorus concentration in the gate electrode is 1 to $5\times10^{19}$ cm$^{-2}$. For this reason, when $BF_2$ is ion-implanted at a dose of 1 to $3\times10^{15}$ cm$^{-2}$, the $BF_2$ penetrates the native oxide film 107 in the subsequent annealing, so a proper $p^+$-type gate of the pMOSFET can be obtained. In addition, phosphorus has been doped into the gate electrode of the nMOSFET in advance. Therefore, even when arsenic having a small diffusion coefficient is used as an impurity for forming an $n^+$-type gate, the problem of the gate depletion does not occur.

The resistances of the diffusion layers and gates are lowered by the salicide technique using Ti or Co. After silicidation, the semiconductor device is completed on the basis of the prior art. That is, the subsequent processes are the same as those in the prior art, and a detailed description thereof will be omitted.

The second embodiment of the present invention will be described next with reference to FIGS. 4A to 4E.

Figure 4A:
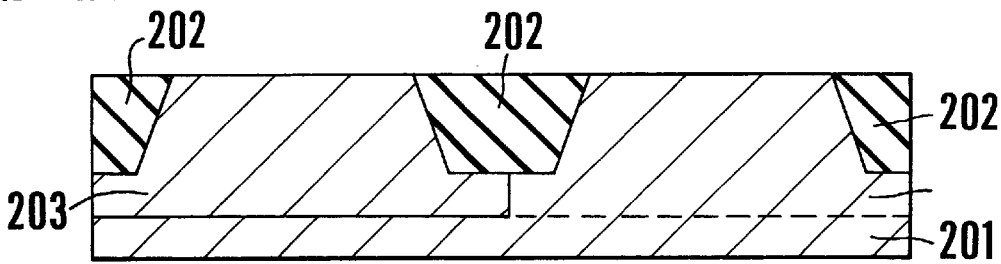
FIGS. 4A to 4E are sectional views showing the steps in manufacturing a semiconductor device according to the second embodiment of the present invention.
Figure 4B:
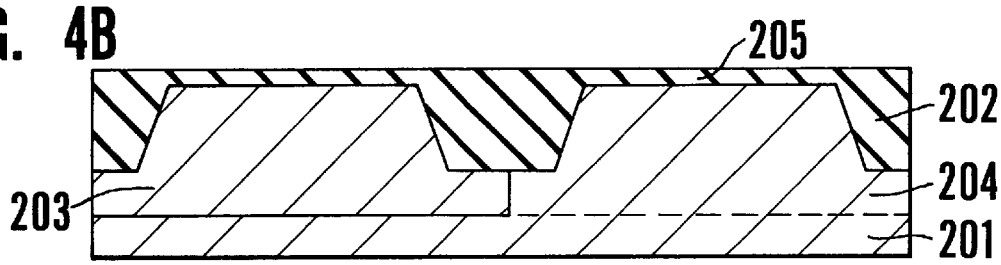

As shown in FIG. 4A, an isolation region 202, an n-type well 203, and a p-type well 204 are formed on one major surface of a semiconductor substrate 201. As shown in FIG. 4B, a gate oxide film 205 with a thickness of 5 to 6 nm is formed in the element region. As a gate electrode material, a phosphorus-doped amorphous silicon film 206 having a thickness of 200 nm is formed on the gate oxide film 205 by LPCVD (Low-Pressure Chemical Vapor Deposition) in the following process sequence.

Figure 4C:
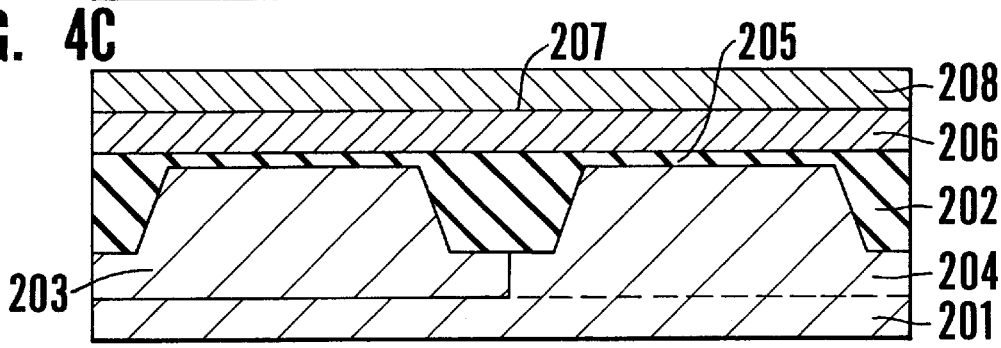

The phosphorus-doped amorphous silicon film 206 is grown at a temperature of 500° C. to 600° C. The concentration of phosphorus is set within the range of 1 to $5\times10^{19}$ cm$^{-3}$. Film deposition is temporarily stopped midway in the formation of the phosphorus-doped amorphous silicon film 206. The film formation atmosphere in the furnace is replaced with an oxidizing atmosphere to form an oxide film 207 with a thickness of about 1 nm on the surface of the first phosphorus-doped amorphous silicon film 206. Thereafter, a second phosphorus-doped amorphous silicon film 208 is formed on the oxide film 207 again. The series of processes can be performed in one furnace (FIG. 4C).

The first and second phosphorus-doped amorphous silicon films 206 and 208 are annealed at a temperature of 800° C. or more and less than 1,000° C. to crystalize the amorphous silicon.

Figure 4D:
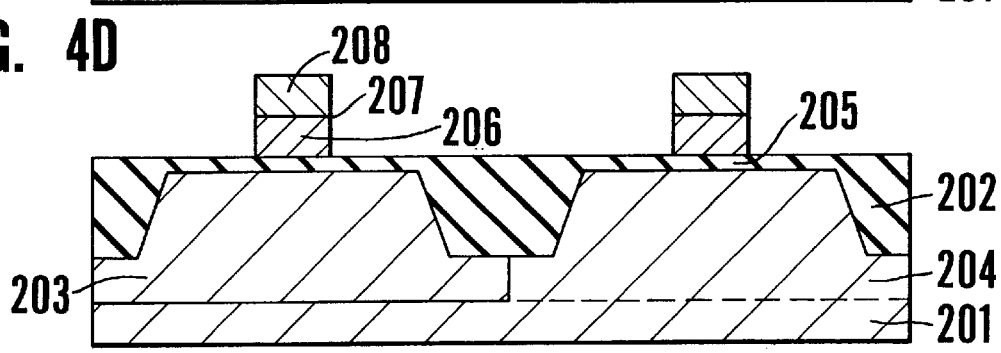
Figure 4E:
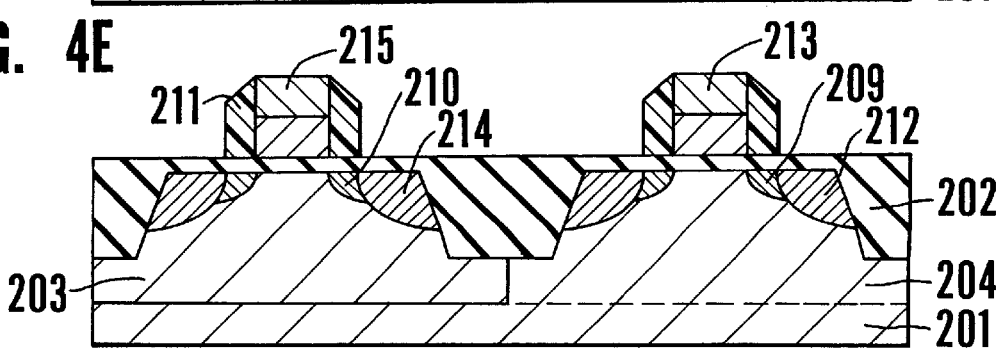
Figure 5:
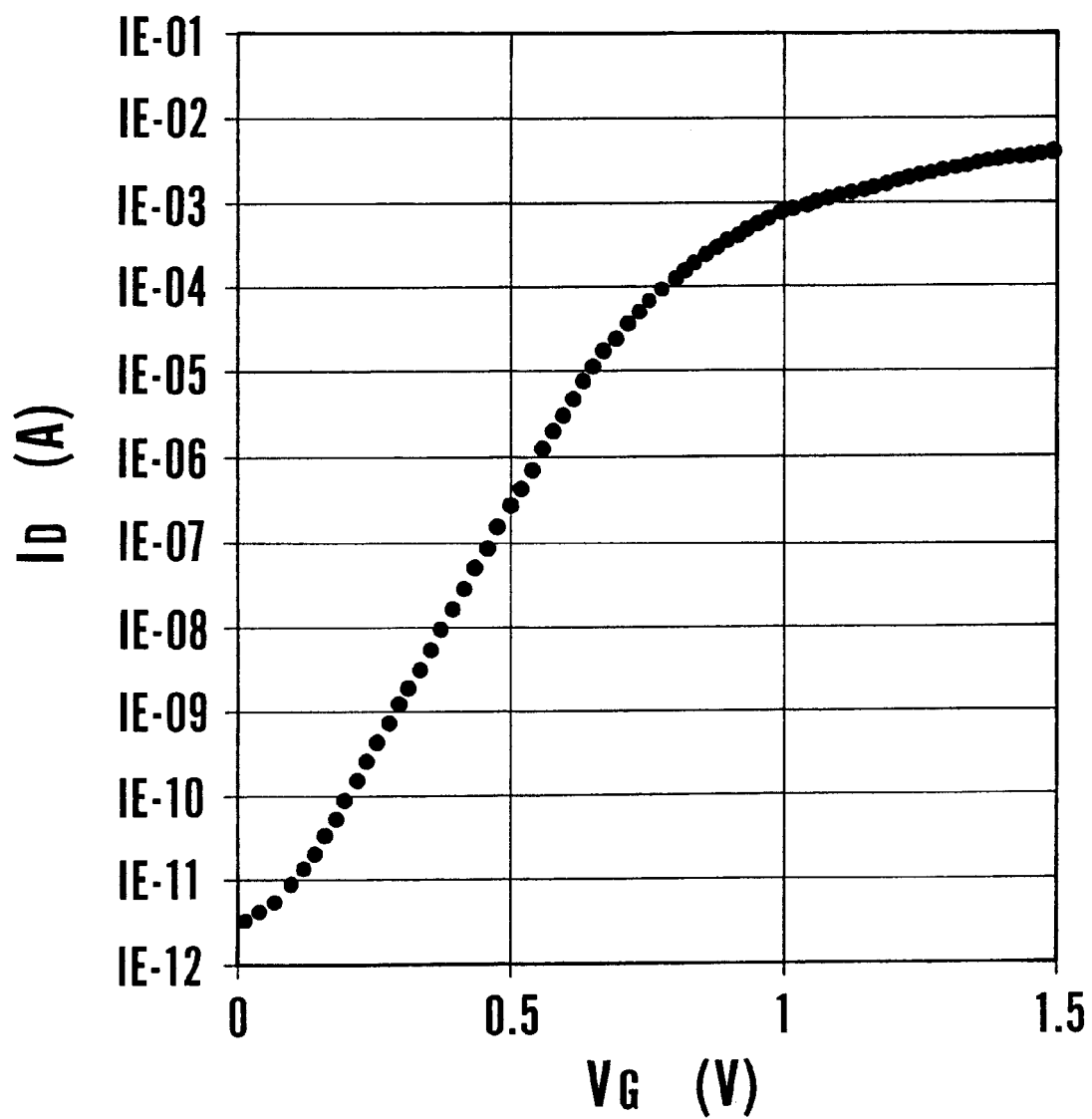
FIG. 5 is a graph showing the subthreshold characteristics of an nMOSFET of the present invention.

Processes after FIGS. 4D and 4E are the same as those after FIGS. 3E and 3F, and a detailed description thereof will be omitted.

In the above-described embodiments, one oxide layer 107 was formed in the phosphorus-doped amorphous silicon layer. However, one oxide layer is not a sufficient condition, and two or more oxide layers may be formed. In fact, it was confirmed that not one but two oxide films are more effective in solving the problem of channeling of arsenic, which is described as the problem to be solved by the present invention.

What is claimed is:

1. A method of manufacturing a complementary MOS semiconductor device, comprising the steps of:

(a) forming a gate insulating film on one major surface of a semiconductor substrate;

(b) forming a first amorphous silicon film on said gate insulating film;

(c) forming an oxide film having a thickness of about 1 nm on a surface of said first amorphous silicon film;

(d) forming a second amorphous silicon film on said oxide film;

(e) annealing said first and second amorphous silicon films to crystalize said first and second amorphous silicon films;

(f) forming said first amorphous silicon film and said second amorphous silicon film into gate electrodes and simultaneously ion-implanting an n-type impurity into nMOSFET regions and a p-type impurity into pMOSFET regions; and (g) activating said n- and p-type impurities by the rapid thermal annealing.

2. A method according to claim 1, wherein said first amorphous silicon film formed in the step (b) comprises a phosphorus-doped amorphous silicon film containing phosphorus at 1 to $5\times10^{19}$ atoms/cm$^3$ in advance.

3. A method according to claim 1, wherein the second amorphous silicon film formed in the step (d) comprises a phosphorus-doped amorphous silicon film containing phosphorus at 1 to $5\times10^{19}$ atoms/cm$^3$ in advance.

4. A method according to claim 1, wherein annealing in the step (e) is performed within a temperature range of not less than 800° C. and less than 1,000° C.

5. A method according to claim 1, wherein said oxide film formed in the step (c) comprises a native oxide film formed on said surface of said first amorphous silicon film by temporarily removing said semiconductor substrate on which said first amorphous silicon film is deposited from a furnace.

6. A method according to claim 1, wherein the series of steps (b) to (d) are in-situ performed in a furnace.

7. A method according to claim 6, wherein film deposition is temporarily stopped midway in the process of forming said first amorphous silicon film, and a film deposition atmosphere in said furnace is replaced with an oxidizing atmosphere to form said oxide film on said surface of said first amorphous silicon film, and then said second amorphous silicon film is deposited on said oxide film in the same furnace.

8. A method according to claim 1, wherein said second amorphous silicon film is formed under the same formation conditions as those for said first amorphous silicon film.

9. A method according to claim 1, wherein the steps (b) to (d) are repeated a plurality of number of times.

* * * * *